US008481395B2

(12) United States Patent
Ahn et al.

(10) Patent No.: US 8,481,395 B2
(45) Date of Patent: Jul. 9, 2013

(54) METHODS OF FORMING A DIELECTRIC CONTAINING DYSPROSIUM DOPED HAFNIUM OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/195,487

(22) Filed: Aug. 1, 2011

(65) Prior Publication Data

US 2011/0287601 A1  Nov. 24, 2011

Related U.S. Application Data

(63) Continuation of application No. 12/390,920, filed on Feb. 23, 2009, now Pat. No. 7,989,285, which is a continuation of application No. 11/053,577, filed on Feb. 8, 2005, now Pat. No. 7,508,648.

(51) Int. Cl.
*H01L 21/20* (2006.01)

(52) U.S. Cl.
USPC ........... 438/381; 438/239; 438/591; 361/311; 361/313

(58) Field of Classification Search
USPC .................. 438/239, 393, 591, 381; 361/311, 361/312, 313
See application file for complete search history.

(56) References Cited

U.S. PATENT DOCUMENTS

| 3,357,961 | A | 12/1967 | Makowski, H. S. et al. |
| 5,562,952 | A | 10/1996 | Nakahigashi et al. |
| 5,572,052 | A | 11/1996 | Kashihara et al. |
| 5,608,670 | A | 3/1997 | Akaogi et al. |
| 5,674,563 | A | 10/1997 | Tarui et al. |

(Continued)

FOREIGN PATENT DOCUMENTS

| EP | 0540993 A1 | 5/1993 |
| EP | 1096042 A1 | 5/2001 |

(Continued)

OTHER PUBLICATIONS

Aarik, Jaan, et al., "Hafnium tetraiodide and oxygen as precursors for atomic layer deposition of hafnium oxide thin films", Thin Solid Films, 418(2), (Oct. 15, 2002), 69-72.

(Continued)

*Primary Examiner* — Phuc Dang
(74) *Attorney, Agent, or Firm* — Schwegman, Lundberg & Woessner, P.A.

(57) ABSTRACT

The use of a monolayer or partial monolayer sequencing process, such as atomic layer deposition, to form a dielectric layer of hafnium oxide doped with dysprosium and a method of fabricating such a combination produces a reliable structure for use in a variety of electronic devices. Forming the dielectric structure can include depositing hafnium oxide onto a substrate surface using precursor chemicals, followed by depositing dysprosium oxide onto the substrate using precursor chemicals, and repeating to form a thin laminate structure. A dielectric layer of dysprosium doped hafnium oxide may be used as the gate insulator of a MOSFET, as a capacitor dielectric in a DRAM, as a tunnel gate insulator in flash memories, or as a dielectric in NROM devices, because the high dielectric constant (high-k) of the film provides the functionality of a thinner silicon dioxide film, and because the reduced leakage current of the dielectric layer when the percentage of dysprosium doping is optimized improves memory function.

20 Claims, 5 Drawing Sheets

U.S. PATENT DOCUMENTS

| | | |
|---|---|---|
| 5,751,021 A | 5/1998 | Teraguchi |
| 5,827,571 A | 10/1998 | Lee et al. |
| 6,020,024 A | 2/2000 | Maiti et al. |
| 6,020,243 A | 2/2000 | Wallace et al. |
| 6,075,691 A | 6/2000 | Duenas et al. |
| 6,087,695 A | 7/2000 | Chen |
| 6,146,976 A | 11/2000 | Stecher et al. |
| 6,289,842 B1 | 9/2001 | Tompa |
| 6,297,539 B1 | 10/2001 | Ma et al. |
| 6,313,035 B1 | 11/2001 | Sandhu et al. |
| 6,420,279 B1 | 7/2002 | Ono et al. |
| 6,455,330 B1 | 9/2002 | Yao et al. |
| 6,495,437 B1 | 12/2002 | Yu |
| 6,509,280 B2 | 1/2003 | Choi |
| 6,514,828 B2 | 2/2003 | Ahn et al. |
| 6,518,634 B1 | 2/2003 | Kaushik et al. |
| 6,551,929 B1 | 4/2003 | Kori et al. |
| 6,559,014 B1 | 5/2003 | Jeon |
| 6,592,942 B1 | 7/2003 | Van Wijck |
| 6,608,378 B2 | 8/2003 | Ahn et al. |
| 6,613,695 B2 | 9/2003 | Pomarede et al. |
| 6,632,279 B1 | 10/2003 | Ritala et al. |
| 6,638,859 B2 | 10/2003 | Sneh et al. |
| 6,652,924 B2 | 11/2003 | Sherman |
| 6,674,138 B1 | 1/2004 | Halliyal et al. |
| 6,686,212 B1 | 2/2004 | Conley, Jr. et al. |
| 6,699,747 B2 | 3/2004 | Ruff et al. |
| 6,709,989 B2 | 3/2004 | Ramdani et al. |
| 6,753,567 B2 | 6/2004 | Maria et al. |
| 6,770,536 B2 | 8/2004 | Wilk et al. |
| 6,777,353 B2 | 8/2004 | Putkonen |
| 6,780,704 B1 | 8/2004 | Raaijmakers et al. |
| 6,784,101 B1 | 8/2004 | Yu et al. |
| 6,794,315 B1 | 9/2004 | Klemperer et al. |
| 6,800,567 B2 | 10/2004 | Cho |
| 6,803,311 B2 | 10/2004 | Choi |
| 6,808,978 B2 | 10/2004 | Kim |
| 6,812,100 B2 | 11/2004 | Ahn et al. |
| 6,818,067 B2 | 11/2004 | Doering et al. |
| 6,821,862 B2 | 11/2004 | Cho |
| 6,821,873 B2 | 11/2004 | Visokay et al. |
| 6,831,315 B2 | 12/2004 | Raaijmakers et al. |
| 6,844,260 B2 | 1/2005 | Sarigiannis et al. |
| 6,858,546 B2 * | 2/2005 | Niinistö et al. ............ 438/785 |
| 6,884,719 B2 | 4/2005 | Chang et al. |
| 6,929,830 B2 | 8/2005 | Tei et al. |
| 6,930,059 B2 | 8/2005 | Conley, Jr. et al. |
| 7,019,351 B2 | 3/2006 | Eppich et al. |
| 7,049,192 B2 | 5/2006 | Ahn et al. |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,199,023 B2 | 4/2007 | Ahn et al. |
| 7,235,501 B2 | 6/2007 | Ahn et al. |
| 7,279,413 B2 | 10/2007 | Park et al. |
| 7,312,494 B2 | 12/2007 | Ahn et al. |
| 7,326,980 B2 | 2/2008 | Ahn et al. |
| 7,989,285 B2 | 8/2011 | Ahn et al. |
| 8,178,413 B2 | 5/2012 | Ahn et al. |
| 8,278,225 B2 | 10/2012 | Ahn et al. |
| 2001/0009695 A1 | 7/2001 | Saanila et al. |
| 2001/0030352 A1 | 10/2001 | Ruf et al. |
| 2001/0052752 A1 | 12/2001 | Ghosh et al. |
| 2002/0001971 A1 | 1/2002 | Cho |
| 2002/0019116 A1 | 2/2002 | Sandhu et al. |
| 2002/0024080 A1 | 2/2002 | Derderian et al. |
| 2002/0025628 A1 | 2/2002 | Derderian et al. |
| 2002/0046705 A1 | 4/2002 | Sandhu et al. |
| 2002/0068466 A1 | 6/2002 | Lee et al. |
| 2002/0094632 A1 | 7/2002 | Agarwal et al. |
| 2002/0132374 A1 | 9/2002 | Basceri et al. |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0192974 A1 | 12/2002 | Ahn et al. |
| 2003/0003635 A1 | 1/2003 | Paranjpe et al. |
| 2003/0043637 A1 | 3/2003 | Forbes et al. |
| 2003/0049942 A1 | 3/2003 | Haukka et al. |
| 2003/0082296 A1 | 5/2003 | Elers et al. |
| 2003/0104666 A1 | 6/2003 | Bojarczuk, Jr. et al. |
| 2003/0106490 A1 | 6/2003 | Jallepally et al. |
| 2003/0119291 A1 | 6/2003 | Ahn et al. |
| 2003/0134038 A1 | 7/2003 | Paranjpe |
| 2003/0141560 A1 | 7/2003 | Sun |
| 2003/0181039 A1 | 9/2003 | Sandhu et al. |
| 2003/0185980 A1 | 10/2003 | Endo |
| 2003/0216038 A1 | 11/2003 | Madhukar et al. |
| 2003/0232511 A1 | 12/2003 | Metzner et al. |
| 2003/0235961 A1 | 12/2003 | Metzner et al. |
| 2004/0007171 A1 | 1/2004 | Ritala et al. |
| 2004/0009679 A1 | 1/2004 | Yeo et al. |
| 2004/0023516 A1 | 2/2004 | Londergan et al. |
| 2004/0028811 A1 | 2/2004 | Cho et al. |
| 2004/0033661 A1 | 2/2004 | Yeo et al. |
| 2004/0043541 A1 | 3/2004 | Ahn et al. |
| 2004/0043557 A1 * | 3/2004 | Haukka et al. ............ 438/240 |
| 2004/0043569 A1 | 3/2004 | Ahn et al. |
| 2004/0043635 A1 | 3/2004 | Vaartstra |
| 2004/0070649 A1 | 4/2004 | Hess et al. |
| 2004/0110391 A1 | 6/2004 | Ahn et al. |
| 2004/0144980 A1 | 7/2004 | Ahn et al. |
| 2004/0166628 A1 | 8/2004 | Park et al. |
| 2004/0168627 A1 | 9/2004 | Conley, Jr. et al. |
| 2004/0171280 A1 | 9/2004 | Conley, Jr. et al. |
| 2004/0203254 A1 | 10/2004 | Conley, Jr. et al. |
| 2004/0213539 A1 | 10/2004 | Anderson et al. |
| 2004/0235313 A1 | 11/2004 | Frank et al. |
| 2004/0264236 A1 * | 12/2004 | Chae et al. ............ 365/154 |
| 2004/0266217 A1 | 12/2004 | Kim et al. |
| 2005/0020017 A1 | 1/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0026458 A1 | 2/2005 | Basceri et al. |
| 2005/0029547 A1 | 2/2005 | Ahn et al. |
| 2005/0051828 A1 | 3/2005 | Park et al. |
| 2005/0141281 A1 | 6/2005 | Jung |
| 2005/0157549 A1 | 7/2005 | Mokhlesi et al. |
| 2005/0260357 A1 * | 11/2005 | Olsen et al. ............ 427/569 |
| 2006/0019033 A1 | 1/2006 | Muthukrishnan et al. |
| 2006/0022252 A1 * | 2/2006 | Doh et al. ............ 257/314 |
| 2006/0027882 A1 | 2/2006 | Mokhlesi |
| 2006/0189154 A1 | 8/2006 | Ahn et al. |
| 2006/0245984 A1 | 11/2006 | Kulkarni et al. |
| 2007/0018214 A1 | 1/2007 | Ahn et al. |
| 2007/0027882 A1 | 2/2007 | Kulkarni |
| 2007/0048926 A1 | 3/2007 | Ahn et al. |
| 2007/0087928 A1 | 4/2007 | Rosenflanz et al. |
| 2007/0181931 A1 | 8/2007 | Ahn et al. |
| 2013/0012031 A1 | 1/2013 | Ahn et al. |

FOREIGN PATENT DOCUMENTS

| | | |
|---|---|---|
| EP | 1124262 A2 | 8/2001 |
| EP | 1324376 A1 | 7/2003 |
| WO | WO-0231875 A2 | 4/2002 |
| WO | WO-2004079796 A3 | 9/2004 |

OTHER PUBLICATIONS

Anwander, Reiner, et al., "Volatile Donor-Functionalized Alkoxy Derivatives of Lutetium and Their Structural Characterization", Inorganic Chemistry, 36(16), (Jul. 30, 1997), 3545-3552.

Aspinall, Helen C., et al., "Growth of Praseodymium Oxide and Praseodymium Silicate Thin Films by Liquid Injection MOCVD", Chemical Vapor Deposition, 10(2), (Mar. 2004), 83-89.

Atanassova, E., et al., "Breakdown Fields and Conduction Mechanisms in thin Ta2O5 Layers on Si for high density DRAMs", Microelectronics Reliability, 42, (2002), 157-173.

Chin, A., et al., "High Quality La2O3 and Al2O3 Gate Dielectrics with Equivalent Oxide Thickness 5-10A", Digest of Technical Papers. 2000 Symposium on VLSI Technology, 2000, Honolulu, (Jun. 13-15, 2000), 16-17.

Colombo, D., et al., "Anhydrous Metal Nitrates as Volatile Single Source Precursors for the CVD of Metal Oxide Films", Communications, Department of EE, U of M, MPLS, MN, (Jul. 7, 1998), 3 pages.

Conley, J. F, "Atomic Layer Deposition of Hafnium Oxide Using Anhydrous Hafnium Nitrate", Electrochemical and Solid-State Letters, 5(5), (May, 2002), C57-059.

Copel, M., et al., "Formation of a stratified lanthanum silicate dielectric by reaction with Si(001)", Applied Physics Letters, 78(11), (Mar. 12, 2001), 1607-1609.

Copel, M., et al., "Structure and stability of ultrathin zirconium oxide layers on Si(001)", Applied Physics Letters, 76(4), (Jan. 2000), 436-438.

Dimoulas, A., et al., "Structural and electrical quality of the high-k dielectric Y2O3 on Si (001): Dependence on growth parameters", Journal of Applied Physics, 92(1), (Jul. 1, 2002), 426-431.

Eisentraut, K. J., "Volatile Rare Earth Chelates", J. Am. Chem. Soc. 87:22, (Nov. 20, 1965), 5254-5256.

Guha, S, et al., "Atomic beam deposition of lanthanum-and yttrium-based oxide thin films for gate dielectrics", Applied Physics Letters, 77, (2000), 2710-2712.

Guha, S., et al., "High temperature stability of Al2O3 dielectrics on Si: Interfacial metal diffusion and mobility degradation", Applied Physics Letters, vol. 81, No. 16, (Oct. 14, 2002), 2956-2958.

Herrmann, Wolfgang A., et al., "Volatile Metal Alkoxides according to the Concept of Donor Functionalization", Angewandte Chemie International Edition in English, 34(20), (1995), 2187-2206.

Hoshino, Y., "Characterization and Control of the HfO2/Si(001) Interfaces", Applied Physics Letters, 81, (Sep. 30, 2002), 2650-2652.

Huang, C. H., et al., "La/sub 2/O/sub 3//Si/sub 0.3/Ge/sub 0.7/ p-MOSFETs with high hole mobility and good device characteristics", IEEE Electron Device Letters, 23(12), (Dec. 2002), 710-712.

Iwai, H., et al., "Advanced gate dielectric materials for sub-100 nm CMOS", International Electron Devices Meeting, 2002. IEDM '02. Digest., (Dec. 8-11, 2002), 625-628.

Jeon, Sanghun, et al., "Excellent electrical characteristics of lanthanide (Pr, Nd, Sm, Gd, and Dy) oxide and lanthanide-doped oxide for MOS gate dielectric applications", Electron Devices Meeting, 2001. IEDM Technical Digest. International, (2001), 471-474.

Jones, A. J, et al., "Some recent developments in the MOCVD and ALD of high k dielectric oxides", J. of Materials Chemistry, par. 3.2, (Sep 2004), 3109.

Ko, Myoung-Gyun, et al., "High density plasma enhanced atomic layer deposition of lanthanum oxide for high-k gate oxide material", 207th Meeting of the Electrochemical Society, (May 2005), 1 page.

Kukli, Kaupo, "Dielectric Properties of Zirconium Oxide Grown by Atomic Layer Deposition from Iodide Precursor", Journal of the Electrochemical Society, 148(12), (2001), F227-F232.

Kukli, Kaupo, "Tailoring the dielectric properties of HfO2-Ta2O5 nanolaminates", Appl. Phys. Lett., 68, (1996), 3737-3739.

Kwo, J., et al., "High E gate dielectrics Gd2O3 and Y2O3 for silicon", Applied Physics Letters, 77(1), (Jul. 3, 2000), 130-132.

Lee, Hyelan, et al., "Electrical characteristics of a Dy-doped HfO2 gate dielectric", Applied Physics Letters, 79(16), (Oct. 15, 2001), 2615-2617.

Liu, J. P., et al., "Epitaxial growth of Pr2O3 on Si(111) and the observation of a hexagonal to cubic phase transition during postgrowth N2 annealing", Applied Physics Letters, 79(5), (Jul. 30, 2001), 671-673.

Lo Nigro, Raffaella, et al., "Mocvd Growth of Pr2O3 High-K Gate Dielectric for Silicon: Synthesis and Structural Investigation", The Electrochemical Society, Inc., 203rd Meeting—Paris, France, (Apr. 27-May 2, 2003), 915-922.

Maria, J. P., et al., "High temperature stability in lanthanum and zirconia-based gate dielectrics", Journal of Applied Physics, 90(7), (Oct. 1, 2001), 3476-3482.

Michaelson, Herbert B., "The work function of the elements and its periodicity", Journal of Applied Physics, 48(11), (Nov. 1977), 4729-4733.

Nabatame, T., et al., "Design and Proof of high quality HfAlO/sub x/film formation for MOSCAPs and nMOSFETs through Layer-by-Layer Deposition and Annealing process", VLSI Technology, 2003. Digest of Technical Papers. 2003 Symposium, (Jun. 10-12, 2003), 25-26.

Nahm, Choon-Woo, "Microstructure and electrical properties of Y2O3-doped ZnO-Pr6O11-based varistor ceramics", Materials Letters, 57(7), (Jan. 2003), 1317-1321.

Nakajima, Anri, "Atomic-layer deposition of ZrO/sub 2/ with a Si nitride barrier layer", Applied Physics Letters, 81(15), (Oct. 2002), 2824-2826.

Nieminen, Minna, et al., "Growth of gallium oxide thin films from gallium acetylacetonate by atomic layer deposition", J. Mater. Chem., 6(1), (1996), 27-31.

Osten, H J, et al., "High-k Gate Dielectrics with Ultra-low Leakage Current Based on Praseodymium Oxide", Technical Digest of IEDM, (2000), 653-656.

Osten, H. J., et al., "Band gap and band discontinuities at crystalline Pr2O3/Si(001) heterojunctions", Applied Physics Letters, 80(2), (Jan. 14, 2002), 297-299.

Osten, H. J., et al., "Growth of crystalline praseodymium oxide on silicon", Journal of Crystal Growth, 235(1-4), (Feb. 2002), 229-234.

Paivasaari, Jani, et al., "A comparative study on lanthanide oxide thin films grown by atomic layer deposition", Thin Solid Films, 472(1-2), First available online in 2004, (Aug. 13, 2004), 275-281.

Perkins, Charles M, et al., "Electrical and materials properties of ZrO2 gate dielectrics grown by atomic layer chemical vapor deposition", Applied Physics Letters, 78(16), (Apr. 2001), 2357-2359.

Rahtu, Antti, "Atomic Layer Deposition of Zirconium Titanium Oxide from Titanium Isopropoxide and Zirconium Chloride", Chemistry of Materials, 13(5), (May 2001), 1528-1532.

Ritala, M, et al., "Atomic layer Deposition of Oxide Thin Films with Metal Alkoxides as Oxygen Sources", Science 288(5464), (Apr. 14, 2000), 319-321.

Rotondaro, A L, et al., "Advanced CMOS Transistors with a Novel HfSiON Gate Dielectric", Symposium on VLSI Technology Digest of Technical Papers, (2002), 148-149.

Shimizu, Takashi, et al., "Electrical Properties of Ruthenium/Metalorganic Chemical Vapor Deposited La-Oxide/Si Field Effect Transistors", Jpn. J. Appl. Phys., vol. 42, Part 2, No. 11A, (2003), L1315-L1317.

Singer, Peter, "Top Tech Challenges for 2005", Semiconductor International, (Sep. 1, 2004), 2 pages.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Van Dover, R. B., "Amorphous lanthanide-doped TiOx dielectric films", Applied Physics Letters, 74(20), (May 17, 1999), 3041-3043.

Wilk, G. D., "High-K gate dielectrics: Current status and materials properties considerations", Journal of Applied Physics, 89(10), (May 2001), 5243-5275.

Williams, Paul A., et al., "Novel Mononuclear Alkoxide Precursors for the MOCVD of ZrO2 and HfO2 Thin Films", Chemical Vapor Deposition, 8(4), (Jul. 2002), 163-170.

Yamada, Hirotoshi, et al., "MOCVD of High-Dielectric-Constant Lanthanum Oxide Thin Films", Journal of the Electrochemical Society, 150(8), (Aug. 2003), G429-G435.

Yamamoto, K., "Effect of Hf metal predeposition on the properties of sputtered HfO2/Hf stacked gate dielectrics", Applied Physics Letters, 81, (Sep. 9, 2002), 2053-2055.

Yu, Xiongfei, et al., "High Mobility and Excellent Electrical Stability of MOSFETs Using a Novel HfTaO Gate Dielectric", 2004 Symposium on VLSI Technology Digest of Technical Papers, (Jun. 15-17, 2004), 110-111.

Zhang, H, et al., "High permitivity thin film nanolaminates", Journal of Applied Physics, 87(4), (Feb. 2000), 1921-1924.

Zhang, H., "Atomic layer deposition of high dielectric constant nanolaminates", Journal of The Electrochemical Society, 148(4), (Apr. 2001), F63-F66.

Zhong, Huicai, et al., "Electrical Properties of Ru and RuO2 Gate Electrodes for Si-PMOSFET with ZrO2 and Zr-Silicate Dielectrics", Journal of Electronic Materials, 30(12), (Dec. 2001), 1493-1498.

* cited by examiner

METHODS OF FORMING A DIELECTRIC CONTAINING DYSPROSIUM DOPED HAFNIUM OXIDE

CROSS REFERENCE TO RELATED APPLICATION(S)

This application is a continuation of U.S. application Ser. No. 12/390,920, filed Feb. 23, 2009, now issued as U.S. Pat. No. 7,989,285, which is a continuation of application Ser. No. 11/053,577, filed Feb. 8, 2005, now issued as U.S. Pat. No. 7,508,648, both of which are incorporated herein by reference in their entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of less than 100 nm. Such scaling of gate dielectrics may be the most difficult issue facing the production of the next generation of MOSFETs. The increasingly small and reliable integrated circuits (ICs) will likely be used in products such as processor chips, mobile telephones, and memory devices such as dynamic random access memories (DRAMs).

Currently, the semiconductor industry relies on the ability to reduce or scale all of the dimensions of its basic devices, such as the silicon based MOSFET, to achieve the required improved operation. This device scaling includes scaling the gate dielectric, which has primarily been formed of silicon dioxide ($SiO_2$). A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created problems as the gate dielectric has become thinner, and generated the need to use other dielectric materials as gate dielectrics, in particular dielectric materials with higher dielectric constants (k).

DETAILED DESCRIPTION

Figure 1:
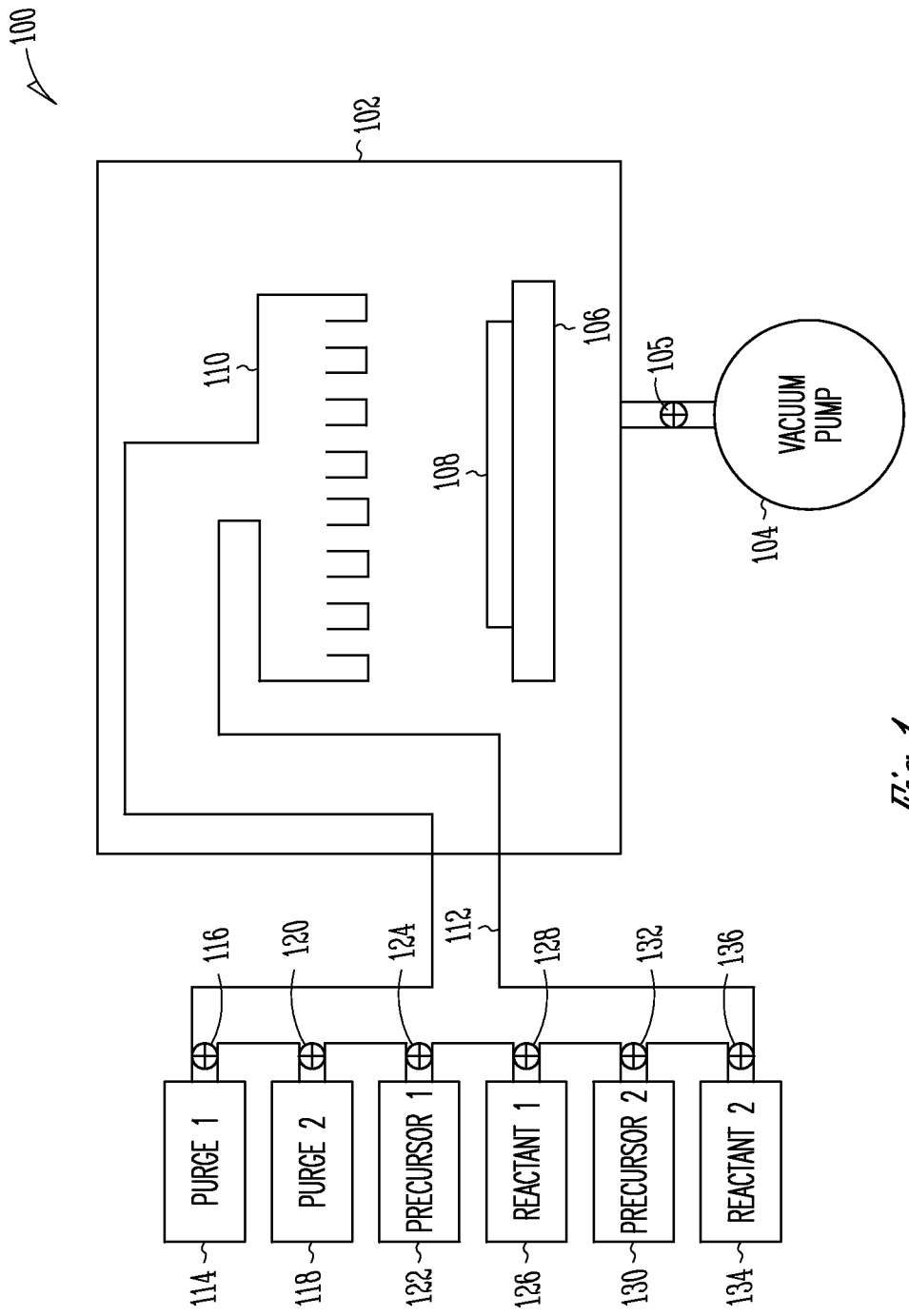
FIG. 1 depicts an atomic layer deposition system for fabricating a dielectric layer formed as a nanolaminate layered sequence of dysprosium oxide and hafnium oxide, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

An embodiment for a method for forming an electronic device includes forming a dielectric layer by using an atomic layer deposition (ALD) technique to form a dielectric having dysprosium oxide (for example $Dy_2O_3$) doped hafnium oxide (for example $HfO_2$). An embodiment includes forming an integrated circuit having a dielectric layer made by using an atomic layer deposition to form dysprosium oxide doped hafnium oxide, and having a conductive layer on the dielectric layer. Another embodiment includes a method of forming a memory array having an atomic layer deposited dielectric layer of dysprosium oxide doped hafnium oxide, contacting a conductive layer and forming an address decoder coupled to the memory array. Embodiments include structures for capacitors, transistors, memory devices, and electronic systems with dielectric layers containing an atomic layer deposited dysprosium doped hafnium oxide dielectric, and methods for forming such structures.

Dysprosium is elemental metal number 66 and is part of the lanthanide series of elements. Hafnium is elemental metal number 72, and is situated next to tantalum and right after the lanthanide metals on the periodic table of elements. Hafnium oxide films can be atomic layer deposited using various precursors such as hafnium tetraiodide and oxygen at a temperature of between 400 to 700 degrees C., or hafnium tetrachloride and steam at 300 degrees C., or anhydrous hafnium nitride ($Hf(NO_3)_4$) and ozone at 160 degrees C. Dysprosium oxide films can be atomic layer deposited using various precursors such as volatile diketonate chelates (for example 2,2, 6,6-tetramethyl-3,5-heptanedione) and ozone at 300 degrees C. Each of these films may have a very tightly controlled thickness for each deposition cycle that depends on the saturation of the substrate surface. For example the hafnium oxide layers may be typically 0.14 nm thick per deposition cycle. If repetitive layers of hafnium oxide are grown upon one another, then the single resulting film of hafnium oxide will have a thickness that is easily controlled by simply controlling the number of deposition cycles run. The surface of the ALD formed is also very smooth and continuous, even over sharp underlying topography. The deposition cycles may also be alternated between the two different oxides and the resulting film may either be a nanolaminate of the two, or more, different oxides, or the oxides may form an alloy with each other if the similarity between the two metals results in miscible materials. In either case the film properties may vary depending upon the ratio of the two or more different materials, and thus materials may be formed that have engineered properties. For example, to form a 10% dysprosium alloy with hafnium oxide, deposit nine layers of hafnium oxide and then one layer of dysprosium oxide and repeat until the desired thickness is achieved.

The dielectric structure is formed by depositing hafnium by atomic layer deposition onto a substrate surface using precursor chemicals to form a film of $HfO_2$, followed by ALD depositing dysprosium onto the substrate using precursor chemicals to form $Dy_2O_3$, and repeating as often as necessary to form a dielectric structure of the required thickness. An alloyed dielectric layer of dysprosium oxide and hafnium oxide may be beneficially used because the relatively high dielectric constant (high-k) of 10-12 of the film, as compared to 3.9 for silicon dioxide, and the excellent current leakage value, provides the functionality of a much thinner silicon dioxide film without the reliability loss consequent to using such physically thin films.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less.

Silicon dioxide is used as a gate dielectric, in part, due to its electrical isolation properties in a $SiO_2$—Si based structure. This electrical isolation is due to the relatively large band gap of $SiO_2$ (8.9 eV), which makes it a good insulator. Significant reductions in its band gap would eliminate it as a material for use as a gate dielectric. However, as the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a thicker or bulk layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying conductive silicon channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{OX}=3.9$, as $$t=(\kappa/\kappa_{OX})t_{eq}=(\kappa/3.9)t_{eq}.$$

Thus, materials with a dielectric constant greater than that of $SiO_2$ will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the future of the microelectronics industry still predicts silicon based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the $t_{eq}$ of the dielectric layer would be the sum of the SiO$_2$ thickness and a multiplicative factor of the thickness, t, of the dielectric being formed, written as $$t_{eq} = t_{SiO2} + (\kappa_{OX}/\kappa)t.$$

Thus, if a SiO$_2$ layer is formed in the process, the $t_{eq}$ is again limited by a SiO$_2$ layer. In the event that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer directly in contact, or interfacing with the silicon layer must provide a high quality interface to maintain high channel carrier mobility.

One of the advantages of using SiO$_2$ as a gate dielectric has been that the formation of the SiO$_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

Candidates to replace SiO$_2$ include high-κ dielectric materials. High-κ materials include materials having a dielectric constant greater than silicon dioxide, for example, dielectric materials having a dielectric constant greater than about twice the dielectric constant of silicon dioxide. An appropriate high-κ gate dielectric should have a large energy gap ($E_g$) and large energy barrier heights with the silicon substrate for both electrons and holes. Generally, the band gap is inversely related to the dielectric constant for a high-κ material, which lessens some advantages of the high-κ material. A set of high-κ dielectric candidates for replacing silicon oxide as the dielectric material in electronic components in integrated circuit includes the lanthanide oxides such as Pr$_2$O$_3$, La$_2$O$_3$, Nd$_2$O$_3$, Sm$_2$O$_3$, Gd$_2$O$_3$, Dy$_2$O$_3$, Ce$_2$O$_3$, Tb$_2$O$_3$, Er$_2$O$_3$, Eu$_2$O$_3$, Lu$_2$O$_3$, Tm$_2$O$_3$, Ho$_2$O$_3$, Pm$_2$O$_3$, and Yb$_2$O$_3$. Other candidates include various lanthanide silicates, zirconium oxide ZrO$_2$, and hafnium oxide HfO$_2$, which as previously noted is element number 72, and the first element after the end of the lanthanide series of the periodic table of elements. Such high dielectric constant layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High energy impacts remove body region particles, creating pits. The surface of such a deposited layer may have a rough contour due to the rough interface at the body region.

In an embodiment, a dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited dielectric film may have an engineered transition with a substrate surface, or may be formed with many thin layers of different dielectric materials to enable selection of the dielectric constant to a value between that available from pure dielectric compounds.

ALD, which may be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of the chemisorbed first precursor. Subsequent to the film growth reaction, reaction byproducts and precursor excess are purged from the reaction chamber. With a precursor chemistry where the precursors adsorb and react with each other on the substrate aggressively, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors may be used, though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The use of highly reactive precursors in ALD may contrast with the precursors for conventional metallo-organic CVD (MOCVD) type reactions.

The by-products in the reaction should be gaseous in order to allow their easy removal from the reaction chamber during a purge stage. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of RS-ALD processes, films can be layered in equal metered sequences that are all identical in chemical kinetics, deposition per cycle, composition, and thickness. RS-ALD sequences generally deposit less than a full layer of the deposited material (for example hafnium oxide) per deposition cycle. Typically, a deposition or growth rate of about 0.25 to about 2.00 Å per RS-ALD cycle can be realized.

The advantages of RS-ALD include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allow for deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the fourth reactant's purging gas. In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of the different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. A nanolaminate may also include having several layers of one material formed by an ALD reaction either over or under a single layer of a different material formed by another type of reaction, such as a MOCVD reaction. The layers of different materials may remain separate after deposition, or they may react with each other to form an alloy layer.

In an embodiment, a nanolaminate layer of hafnium oxide is formed on a substrate mounted in a reaction chamber using RS-ALD. Alternatively, multiple layers may be formed in a repetitive sequence using precursor gases individually pulsed into the reaction chamber. An embodiment includes forming the hafnium oxide layers using a precursor gas such as hafnium tetra-iodide having a chemical formula of $HfI_4$, or hafnium tetra-chloride having a formula of $HfCl_4$, or anhydrous hafnium nitride having a formula of $Hf(NO_3)_4$. An embodiment includes forming the dysprosium oxide using a diketonate chelate precursor gas such as tetramethyl heptanedione or dipivaloylmethane. Other solid or liquid precursors may be used in an appropriately designed reaction chamber. The use of such precursors in an RS-ALD reaction chamber may result in lower deposition temperatures in the range of 160 to 300 degrees Celsius, and the ability to use mildly oxidizing reactant materials such as $H_2O$, $H_2O_2$, various alcohols, $N_2O$, ozone or oxygen. Purge gases may include nitrogen, helium, argon or neon. The dysprosium doped hafnium films formed may have good thermal and electrical properties, with a high dielectric constant k=10 to 12. Such films may survive high temperature anneals (sometimes used to reduce fixed surface state charges and improve metal to semiconductor resistance) of up to 1000 degrees Celsius, and have low leakage currents of less than $2\times10^{-7}$ $A/cm^2$ at electric field strengths of one MVolts/cm.

FIG. 1 shows an embodiment of an atomic layer deposition system 100 for forming a dielectric film containing dysprosium oxide doped hafnium oxide. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to as a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately as required for the particular desired result. Furthermore, additional purging gas sources can be constructed in ALD system 100, one purging gas source for each different precursor and reactant gas, for example. For a process that uses the same purging gas for multiple precursor gases fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for depositing Dy doped $HfO_2$ films, other commercially available ALD systems may also be used.

The use, construction and operation of reaction chambers for deposition of films are understood by those of ordinary skill in the art of semiconductor fabrication. A variety of such commercially available reaction chambers may be used. Furthermore, one of ordinary skill in the art will comprehend the necessary detection, measurement, and control techniques in the art of semiconductor fabrication upon reading and understanding the disclosure.

The elements of ALD system 100 may be controlled by a computer. To focus on the use of ALD system 100 the computer is not shown. Those skilled in the art can appreciate that the individual elements such as pressure control, temperature control, and gas flow within ALD system 100 can be under computer control.

Figure 2:
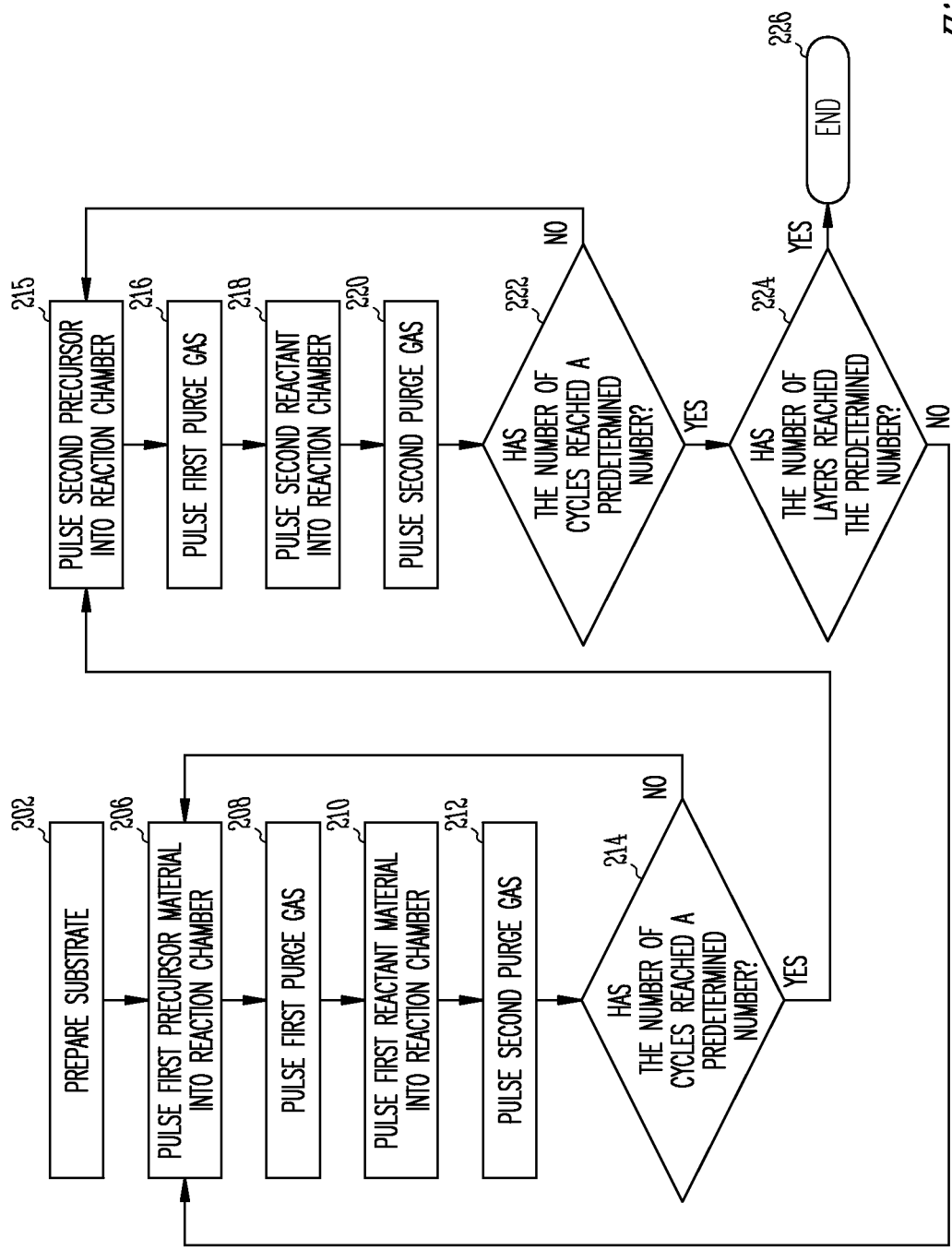
FIG. 2 illustrates a flow diagram of elements for an embodiment of a method to form a dielectric layer containing dysprosium doped hafnium oxide by atomic layer deposition according to various embodiments.

FIG. 2 illustrates a flow diagram of operational steps for an embodiment of a method to form a nanolaminate dielectric layer containing dysprosium oxide layers alternating with hafnium oxide layers in various ways, such as nine layers of hafnium oxide and one layer of dysprosium oxide, which pattern may be repeated until a film of a desired thickness is formed. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102. At 206 a first precursor material enters the reaction chamber for a predetermined length of time, for example 0.5-2.0 seconds. The first precursor material is chemically adsorbed onto the surface of the substrate, the amount depending upon the temperature of the substrate, in one embodiment 300° C., and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 208 a first purge gas enters the reaction chamber for a predetermined length of time sufficient to remove substantially all of the non-chemisorbed first precursor material. Typical times may be 1.0-2.0 seconds with a purge gas comprising nitrogen, argon, neon, combinations thereof, or other gases such as hydrogen. At 210 a first reactant gas enters the chamber for a predetermined length of time, sufficient to provide enough of the reactant to chemically combine with the amount of chemisorbed first precursor material on the surface of the substrate. Typical reactant materials include mildly oxidizing materials, including, but not limited to, water vapor, hydrogen peroxide, nitrogen oxides, ozone and oxygen gas, and combinations thereof. At 212 a second purge gas, which may be the same or different from the first purge gas, enters the chamber for a predetermined length of time, sufficient to remove substantially all non-reacted materials and any reaction byproducts from the chamber.

At 214 a decision is made as to whether or not the thickness of the first dielectric material in the dielectric has reached the desired thickness, or whether another deposition cycle is required. If another deposition cycle is needed, then the operation returns to 206, until the desired first dielectric layer is completed, at which time the process moves on to the deposition of the second material at 215. At 215 a second precursor material enters the reaction chamber for a predetermined length of time, typically 0.5-2.0 seconds. The second precursor material is chemically adsorbed onto the surface of the substrate, in this case being the top surface of the first dielectric material, the amount of absorption depending upon the temperature of the substrate, and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate. At 220 another purge gas enters the chamber, which may be the same or different from any of the three previously discussed purge gases, for a predetermined length of time, sufficient to remove substantially all non-reacted materials and any reaction byproducts from the chamber.

At 222 a decision is made as to whether or not the thickness of the second dielectric material in the nanolaminate dielectric has reached the desired thickness, or whether another deposition cycle is required. If another deposition cycle is needed, then the operation returns to 215, until the desired second dielectric layer is completed. The desired thicknesses of the first and second dielectric materials in the dielectric may not be the same thickness, and there may be more deposition cycles for one dielectric material as compared to the other. If the second dielectric layer has reached the desired thickness, the process moves on to a decision at 224 of whether the number of layers of the first and second dielectric materials has reached the desired number. In this illustrative embodiment, a single layer of the first dielectric and a single layer of the second dielectric have been completed at this point in the process. If more than a single layer of each dielectric material is desired, the process moves back to another deposition of the first dielectric material at 206. After the number of interleaved layers of dielectrics one and two has reached the desired value, the deposition ends at 226. Because the dielectric values of the RS-ALD oxides in the described embodiment are high, for example dysprosium doped hafnium oxide may have a dielectric constant of 10 to 12, and because the highly controlled layer thickness may be a single monolayer for each one of the interleaved dielectric layers, the physical thickness needed to obtain the equivalent dielectric properties of a very thin silicon dioxide layer may have from two to ten layers of the two dielectric materials described in the embodiments.

The embodiments described herein provide a process for growing a dielectric film having a wide range of useful equivalent oxide thickness, $t_{eq}$, associated with a dielectric constant in the range from about 10 to about 14. This range of dielectric constants provides for a $t_{eq}$ ranging about 33% relative to a given silicon dioxide thickness. For an acceptable equivalent silicon dioxide thickness, an embodiment for a dysprosium doped hafnium oxide may have a physical thickness that is three times larger than the acceptable silicon dioxide thickness, providing enhanced probability for reducing leakage current. Controlling the amount of dysprosium doping in the hafnium film in the range of 5 to 15% results in relatively low leakage current as compared to pure hafnium oxides. In an embodiment, the dysprosium percentage is 10% of the hafnium film. Additionally, the novel process can be implemented to form transistors, capacitors, memory devices, and other electronic systems including information handling devices. The present subject matter is not limited to two dielectric materials, and the equipment described in FIG. 1 could have included a precursor and reactant 3, 4, which are not described for simplicity.

Figure 3:
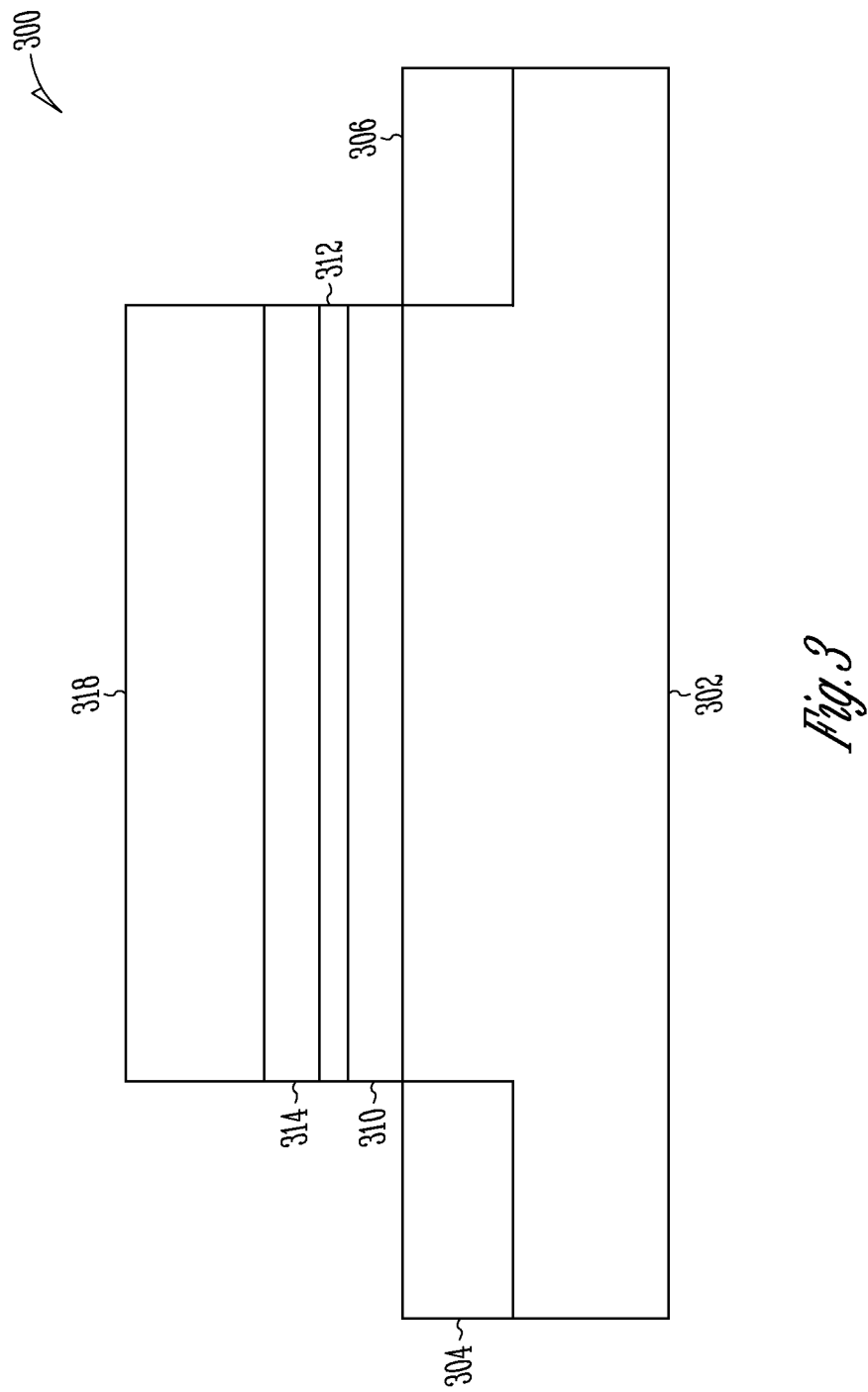
FIG. 3 illustrates an embodiment of a configuration of a transistor having a dielectric layer containing an atomic layer deposited dielectric layer containing dysprosium doped hafnium oxide.

FIG. 3 illustrates a single transistor in an embodiment of a method to form a dielectric layer containing an RS-ALD deposited dysprosium doped hafnium gate oxide layer. This embodiment may be implemented with the system 100 of FIG. 1 used as an atomic layer deposition system. A substrate 302 is prepared, typically a silicon or silicon containing material. In other embodiments, germanium, gallium arsenide, silicon-on-sapphire substrates, or other suitable substrates may also be used. The preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide as an interface between silicon based substrate and dielectric formed using the atomic layer deposition process. The sequencing of the formation of the regions of the transistor being processed may follow the generally understood fabrication of a MOS transistor as is well known to those skilled in the art.

The dielectric covering the area on the substrate 302 between the source and drain diffused regions 304 and 306 may be deposited by RS-ALD in this illustrative embodiment, and may comprise one or more hafnium oxide layers 310 and 314, each potentially formed of many individual hafnium oxide layers, in an embodiment, nine layers. There is shown an interleaved dysprosium oxide layer 312, in an embodiment, one layer. Alternatively, there may be other combinations of interleaved and non-interleaved layers of varying thickness and deposition method. This nanolaminate dielectric layer is referred to as the gate oxide, and while shown as distinct layers for clarity, is a single alloyed layer, or doped layer. There may be a diffusion barrier layer inserted between the first dielectric layer 310 and the substrate 302 to prevent metal contamination from affecting the electrical properties of the device. The illustrative embodiment shows the two hafnium dielectric layers 310 and 314 having the same thickness, however the desired dielectric properties of the nanolaminate film may be best achieved by adjusting the ratio of the thickness of the two dielectric layers to different values. The transistor 300 has a conductive material forming a gate 318 in this illustrative embodiment, but the nanolaminate dielectric may also be used in a floating gate device such as an EEPROM transistor, as either one or both of the floating gate and the control gate oxide layers. The conductive material may be polysilicon or various metals.

In an illustrative embodiment, the gate dielectric (layers 310-314) include a tunnel gate insulator and a floating gate dielectric in a flash memory device. Use of dielectric layers containing a nanolaminate atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
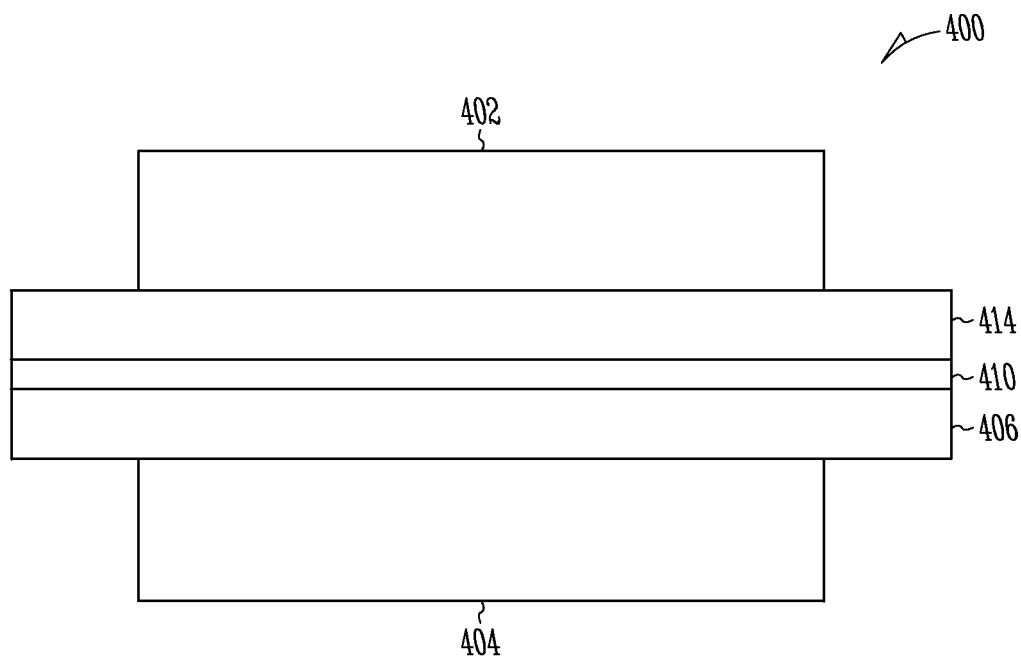
FIG. 4 shows an embodiment of a configuration of a capacitor having a dielectric layer containing an atomic layer deposited dysprosium doped hafnium oxide.

The embodiments of methods for forming dielectric layers containing a RS-ALD deposited dielectric layer contacting a conductive layer may also be applied to forming capacitors in various integrated circuits, memory devices, and electronic systems. In an embodiment including a capacitor 400 illustrated in FIG. 4, a method includes forming a first conductive layer 402, a second conductive layer 404, having a nanolaminate dielectric having interleaved layers 406-414 of two different dielectric materials, formed between the two conductive layers. The conductive layers 402 and 404 may include metals, doped polysilicon, silicided metals, polycides, or conductive organic compounds, without affecting the teachings of this embodiment. The sequencing and thickness of the individual layers depends on the application and may include a single layer of each material, one layer of one of the materials and multiple layers of the other, or other combinations of layers including different layer thicknesses. By selecting each thickness and the composition of each layer, a nanolaminate structure can be engineered to have a predetermined dielectric constant and composition. In an embodiment, the total thickness of layers 406 and 414 is ten times the thickness of layer 410, providing a 10% doping of layer 410 material (for example dysprosium oxide) in the layer 406/414 material (for example hafnium oxide). Although the oxide layers are shown in this illustrative example as being distinct layers, the oxide may be alloyed together to form a single material layer. Structures such as the nanolaminate structure shown in FIGS. 3 and 4 may be used in NROM flash memory devices as well as other integrated circuits. Transistors, capacitors, and other devices having dielectric films may be implemented into memory devices and electronic systems including information handling devices. Embodiments of these information handling devices include wireless systems, telecommunication systems, computers and integrated circuits.

Figure 5:
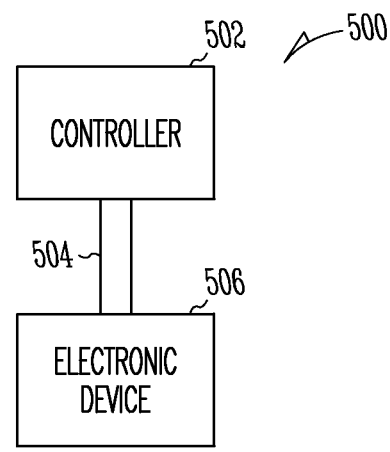
FIG. 5 is a simplified diagram for an embodiment of a controller coupled to an electronic device.

FIG. 5 illustrates a diagram for an electronic system 500 having one or more devices having a dielectric layer containing an atomic layer deposited oxide layer formed according to various embodiments. Electronic system 500 includes a controller 502, a bus 504, and an electronic device 506, where bus 504 provides electrical conductivity between controller 502 and electronic device 506. In various embodiments, controller 502 and/or electronic device 506 includes an embodiment for a dielectric layer containing a nanolaminate RS-ALD deposited oxide layer as previously discussed herein. Electronic system 500 may include, but is not limited to, information handling devices, wireless systems, telecommunication systems, fiber optic systems, electro-optic systems, and computers.

Figure 6:
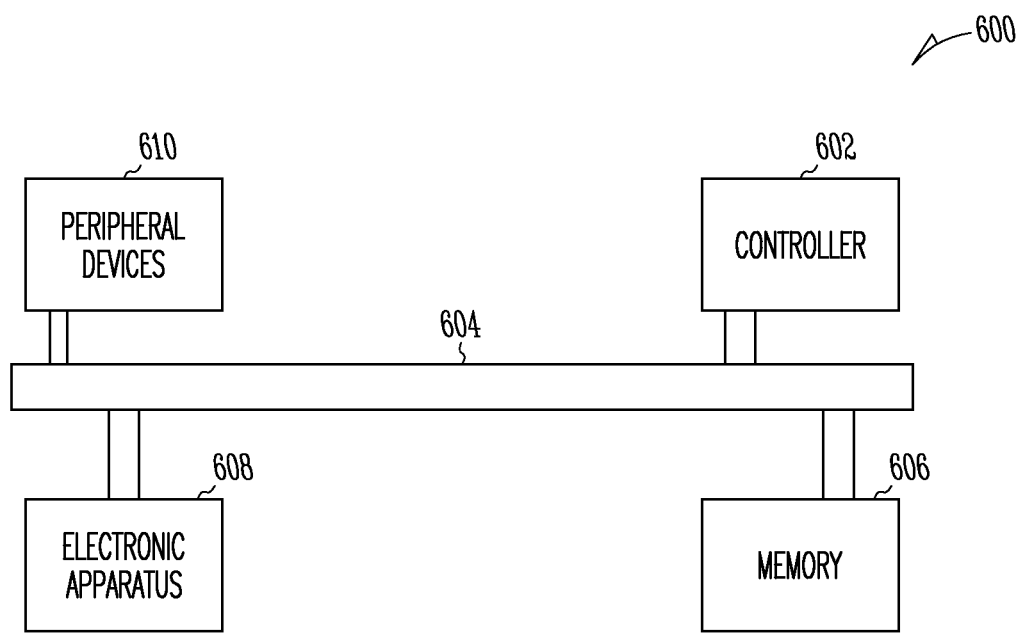
FIG. 6 illustrates a diagram for an embodiment of an electronic system having devices with a dielectric film containing an atomic layer deposited nanolaminate layered sequence of praseodymium oxide and zirconium oxide dielectric layer.

FIG. 6 depicts a diagram of an embodiment of a system 600 having a controller 602 and a memory 606. Controller 602 and/or memory 606 includes a dielectric layer having a nanolaminate RS-ALD dielectric layer. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a dielectric layer having a nanolaminate RS-ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of nanolaminate dysprosium doped hafnium oxide layers by a nanolaminate RS-ALD deposition may be realized using a diketonate type chelate precursor chemical, such as $Dy(thd)_3$, and an oxidizing precursor, such as ozone. Further, such doped dielectric films formed by RS-ALD processed in relatively low temperatures, such as 300° C. or even 160° C., may be amorphous and possess smooth surfaces. Such RS-ALD oxide films may provide enhanced electrical properties as compared to physical deposition methods, such as sputtering or typical chemical layer depositions, due to their smoother surface, and reduced damage, resulting in reduced leakage current. Additionally, such dielectric layers provide a significantly thicker physical thickness than a silicon oxide layer having the same equivalent oxide thickness, where the increased thickness may also reduce leakage current issues. These properties of RS-ALD deposited dielectric layers allow for application as dielectric layers in electronic devices and systems.

Dysprosium doped hafnium oxides have beneficial properties for gate dielectrics and capacitor dielectric materials including thermal stability, high dielectric constant and low leakage currents. The conductive layers contacting the dielectric may include metals, semiconductor materials, polycrystalline semiconductor materials and doped materials of either conductivity type.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant (κ) substantially higher than that of silicon oxide, such that these dielectric films possess an equivalent thickness, $t_{eq}$, thinner than $SiO_2$ gate dielectrics of the same physical thickness. Alternately, the high dielectric constant relative to silicon dioxide allows the use of much larger physical thickness of these high-κ dielectric materials for the same $t_{eq}$ of $SiO_2$. Film having the relatively larger physical thickness aids in processing gate dielectrics and other dielectric layers in electronic devices and systems, and improves the electrical properties of the dielectrics.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the embodiments of the present invention should be determined with reference to the appended claims, along with the full scope of equivalents to which such claims are entitled.

What is claimed is:

1. A method comprising:
   forming a dielectric containing hafnium oxide doped with dysprosium by applying a number of deposition cycles of a monolayer or partial monolayer sequencing process including applying a first number of deposition cycles of the monolayer or partial monolayer sequencing process to provide hafnium and applying a second number of deposition cycles of the monolayer or partial monolayer sequencing process to provide dysprosium; and
   selecting the first number and the second number to provide a selected amount of dysprosium in the hafnium oxide.

2. The method of claim 1, wherein the monolayer or partial monolayer sequencing process is a self-limiting process.

3. The method of claim 1, wherein the method includes forming an electrically conductive material on the dielectric.

4. The method of claim 3, wherein forming the electrically conductive material includes forming a metal, a doped polysilicon, a silicided metal, a polycide, or a conductive organic compound.

5. The method of claim 1, wherein forming the dielectric includes forming an amorphous hafnium oxide doped with dysprosium.

6. The method of claim 1, wherein the method includes forming a diffusion barrier on which the dielectric is formed such that the diffusion barrier separates the dielectric from a substrate on which the dielectric is formed.

7. The method of claim 1, wherein forming the dielectric containing hafnium oxide doped with dysprosium includes forming the dielectric containing hafnium oxide doped with dysprosium oxide.

8. The method of claim 1, wherein applying the second number of deposition cycles of the monolayer or partial monolayer sequencing process to provide dysprosium includes using $Dy(thd)_3$, where thd is dipivaloylmethane, or tetramethyl heptanedione as a precursor.

9. The method of claim 1, wherein the method includes forming the dielectric structured as a tunnel gate insulator in a transistor.

10. The method of claim 1, wherein the method includes forming a capacitor with the dielectric structured between and contacting two conductive materials of the capacitor.

11. A method comprising:
forming a nanolaminate containing hafnium oxide doped with dysprosium, the hafnium oxide doped with dysprosium formed by applying a number of deposition cycles of a monolayer or partial monolayer sequencing process including applying a first number of deposition cycles of the monolayer or partial monolayer sequencing process to provide hafnium and applying a second number of deposition cycles of the monolayer or partial monolayer sequencing process to provide dysprosium;
selecting the first number and the second number to provide a selected amount of dysprosium in the hafnium oxide; and
forming a conductive material such that the conductive material is coupled to the nanolaminate.

12. The method of claim 11, wherein the conductive material comprises a metal.

13. The method of claim 11, wherein the nanolaminate includes only one other insulating material different from the hafnium oxide doped with dysprosium.

14. The method of claim 11, wherein forming the nanolaminate includes forming dysprosium oxide.

15. A method comprising:
forming a memory having a memory array;
forming a dielectric in the memory array, the dielectric containing hafnium oxide doped with dysprosium, the hafnium oxide doped with dysprosium formed by applying a number of deposition cycles of a monolayer or partial monolayer sequencing process including applying a first number of deposition cycles of the monolayer or partial monolayer sequencing process to provide hafnium and applying a second number of deposition cycles of the monolayer or partial monolayer sequencing process to provide dysprosium; and
selecting the first number and the second number to provide a selected amount of dysprosium in the hafnium oxide.

16. The method of claim 15, wherein the method includes forming a capacitor having the dielectric disposed between two conductor materials of the capacitor.

17. The method of claim 15, wherein the method includes forming the dielectric structured as a nanolaminate in a NROM flash memory device.

18. The method of claim 15, wherein the method includes forming the dielectric structured as a tunnel gate insulator in a transistor.

19. The method of claim 15, wherein the method includes forming an electrically conductive material contacting the dielectric.

20. The method of claim 19, wherein forming the electrically conductive material contacting the dielectric includes forming a metal, a doped polysilicon, a silicided metal, a polycide, or a conductive organic compound.

* * * * *